(12) United States Patent
Jung et al.

(10) Patent No.: US 8,304,808 B2
(45) Date of Patent: Nov. 6, 2012

(54) ELECTRIC FIELD READ/WRITE HEAD

(75) Inventors: Ju-hwan Jung, Seoul (KR);
Hyoung-soo Ko, Seoul (KR);
Seung-bum Hong, Seongnam-si (KR)

(73) Assignee: Seagate Technology LLC, Cupertino, CA (US)

( * ) Notice: Subject to any disclaimer, the term of this patent is extended or adjusted under 35 U.S.C. 154(b) by 589 days.

(21) Appl. No.: 12/120,816

(22) Filed: May 15, 2008

(65) Prior Publication Data

US 2009/0090936 A1    Apr. 9, 2009

(30) Foreign Application Priority Data

Oct. 8, 2007    (KR) ..................... 10-2007-0100890

(51) Int. Cl.
*H01L 29/66* (2006.01)

(52) U.S. Cl. .................... 257/192; 257/197; 257/200

(58) Field of Classification Search .................. 257/200, 257/197, 192
See application file for complete search history.

(56) References Cited

U.S. PATENT DOCUMENTS

| | | | | |
|---|---|---|---|---|
| 5,701,019 | A * | 12/1997 | Matsumoto et al. | 257/192 |
| 6,352,889 | B1 * | 3/2002 | Nishitsuji | 438/240 |
| 2004/0079965 | A1 * | 4/2004 | Tamura et al. | 257/200 |
| 2007/0023783 | A1 * | 2/2007 | Hase et al. | 257/197 |

* cited by examiner

*Primary Examiner* — Kenneth Parker
*Assistant Examiner* — Dale E Page
(74) *Attorney, Agent, or Firm* — Hall Estill Attorneys at Law

(57) ABSTRACT

Provided is an electric field head including a resistance sensor to read information recorded on a recording medium. The resistance sensor includes a first semiconductor layer including a source and a drain, and a second semiconductor layer that is heterogeneously combined with the first semiconductor layer. Also, the electric field head further includes a channel between the source and the drain, in a junction region of the first and second semiconductor layers.

20 Claims, 5 Drawing Sheets

ELECTRIC FIELD READ/WRITE HEAD

CROSS-REFERENCE TO RELATED PATENT APPLICATIONS

This application claims the benefit of Korean Patent Application No. 10-2007-0100890, filed on Oct. 8, 2007, in the Korean Intellectual Property Office, the disclosure of which is incorporated herein in its entirety by reference.

BACKGROUND OF THE INVENTION

1. Field of the Invention

The present invention relates to a read/write head and an information storage device, and more particularly, to an electric field read/write head, a method of manufacturing the same, and an information storage device comprising the electric field read/write head.

2. Description of the Related Art

In general, magnetic recording type HDDs (hard disk drives) adopt a magnetic recording method. However, since a magnetic field has a loop shape, it is difficult to generate a strong local magnetic field using a magnetic recording type read/write head, that is, a magnetic read/write head. Due to this restriction, there is a limit in increasing a recording density using the magnetic recording method.

To overcome the limit in the recording density of the magnetic recording type HDDs, researches on a read/write head using an electric field, that is, an electric field read/write head, and a ferroelectric recording medium on which data is recorded by an electric field have been conducted. Since local write energy (an electric field) that is stronger than that in the magnetic recording method, can be generated using an electric field read/write head, the recording density can be increased to be over 1 Tb/in$^2$.

FIG. 1 illustrates a conventional electric field read/write head. Referring to FIG. 1, a resistance sensor having a source S1, a drain D1, and a channel C1 therebetween is provided on a Si substrate 1. An insulation layer 2 and a write electrode 3 are sequentially provided on the channel C1. An electrical domain can be polarized into a first direction and the opposite direction thereof (hereinafter, referred to as the "second direction") on a surface of a recording medium by applying a write voltage to the write electrode 3. The electrical domain polarized into the first and second directions can respectively correspond to data "0" and "1". During a read operation, the channel C1 is located on the polarized electrical domain and a current between the source S1 and the drain D1 is measured. Since the amount of current changes according to the polarization direction of the electrical domain, information written to the electrical domain can be determined.

However, the conventional electric field read/write head has the following problem. During the manufacturing of the conventional electric field read/write head, the thickness of the channel C1 is controlled according to a condition of an ion implantation process. In this case, it is difficult to control the thickness of the channel C1 to be thin. As the thickness of the channel C1 decreases, the resolution of the resistance sensor is improved according to a head movement direction, that is, a direction parallel to a track (hereinafter, referred to as the "track direction"). Considering this fact, it is difficult to implement the resistance sensor exhibiting a superior resolution with conventional technology. When a plurality of resistance sensors are formed on a single Si wafer, it is highly likely that the thickness of the channel C1 changes according to a location, in the conventional technology. Thus, it may be difficult to secure reproducibility and regularity of the conventional field read/write head according to the conventional technology.

Also, to increase the resolution of the resistance sensor in the track direction that is, the head movement direction, a shield layer is preferably provided at both sides of the channel C1 according to the track direction. In the conventional structure as shown in FIG. 1, it is difficult to form a shield layer in the substrate 1, under the channel C1. Accordingly, during a read operation, it is difficult to block an effect of magnetic field interference generated around a certain recording area where information is to be read.

In addition, in the conventional electric field read/write head, the sensitivity of the resistance sensor can be deteriorated due to a drain induced barrier lowering (DIBL) effect. That is, a depletion region of the drain D1 increases a drain current so that the sensitivity is lowered, and this problem can be serious as the length of the channel C1 decreases.

SUMMARY OF THE INVENTION

Various embodiments of the present disclosure are generally directed to an electric field head.

In accordance with some embodiments, a resistance sensor of the electric field head comprises a first semiconductor layer defining a source and a drain, and a second semiconductor layer heterogeneously combined with the first semiconductor layer to form a channel between the source and the drain as a heterojunction region of the first and second semiconductor layers. An air bearing surface (ABS) layer of the electric field head is configured to hydrodynamically support the resistance sensor adjacent a rotatable recording medium as the resistance sensor senses data stored thereto.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
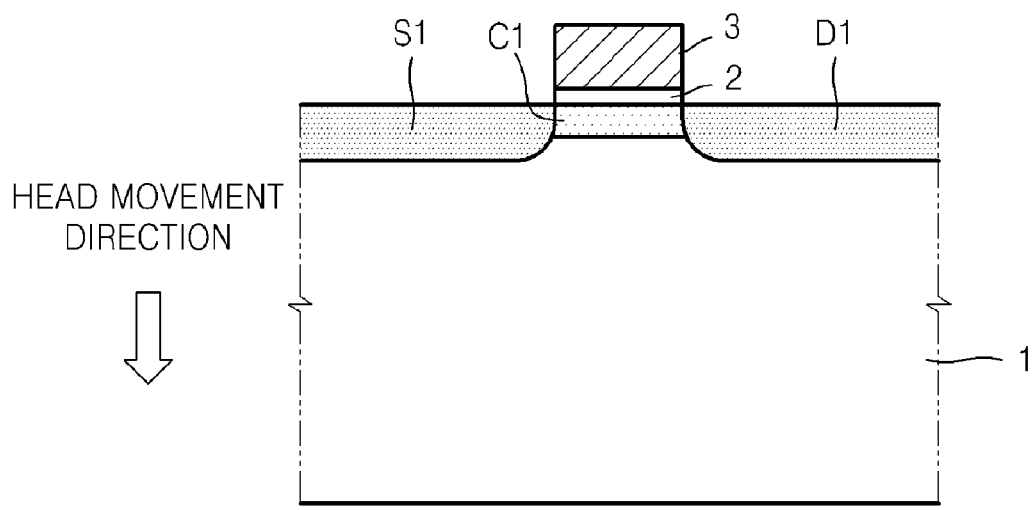
FIG. 1 is a cross-sectional view of a conventional electric field read/write head.

Hereinafter, an electric field read/write head, a method of manufacturing the same, and an information storage device comprising the electric field read/write head according to embodiments of the present invention will be described in detail with reference to the accompanying drawings. The widths and thicknesses of layers or regions in the drawings are rather exaggerated for the clarity of the specification. In the drawings, like reference numerals denote like constituent elements.

Figure 2:
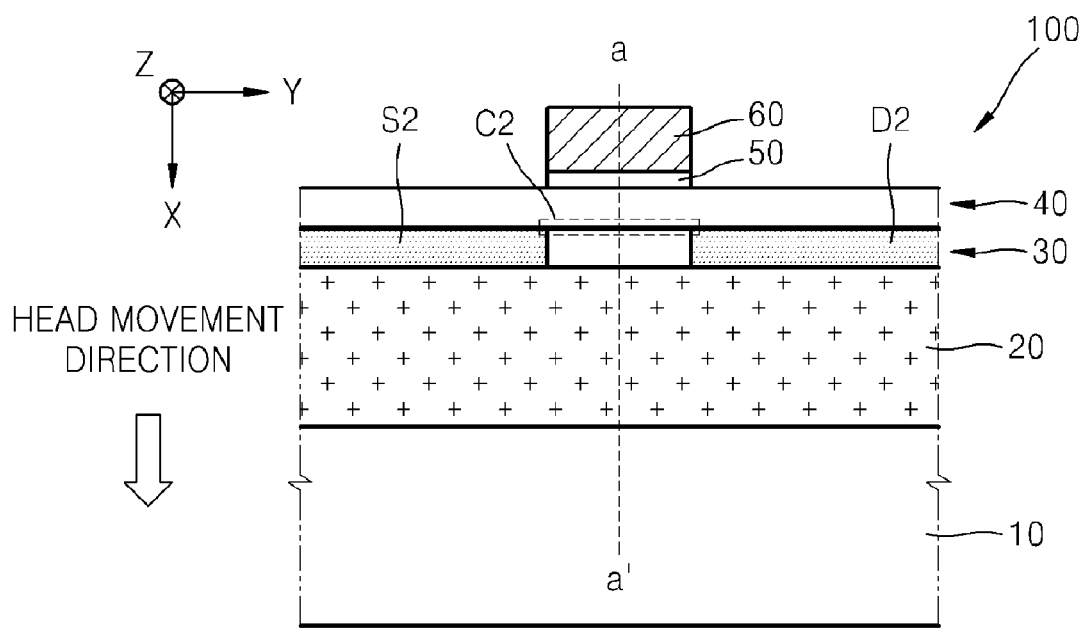
FIG. 2 is a cross-sectional view of an electric field read/write head according to an embodiment of the present invention.

FIG. 2 is a cross-sectional view of an electric field read/write head 100 according to an embodiment of the present invention.

Referring to FIG. 2, an underlayer 20, a first semiconductor layer 30, and a second semiconductor layer 40 are sequentially formed on a substrate 10. The substrate 10 may be a GaAs substrate. The underlayer 20, the first semiconductor layer 30, and the second semiconductor layer 40 may be, respectively, a first AlGaAs layer, a InGaAs layer, and a second AlGaAs layer. The forming of the underlayer 20 is optional. The first semiconductor layer 30 and the second semiconductor layer 40 are heterogeneously combined. A conduction band of the second semiconductor layer 40 can be lower than that of the first semiconductor layer 30. The thickness of the underlayer 20 is preferably over 100 nm, the thickness of the first semiconductor layer 30 is preferably about between 10-30 nm, and the thickness of the second semiconductor layer 40 is preferably about over 10 nm. The In content in the InGaAs layer can be not more than 22 at. % and the Al content in each of the first and second AlGaAs layers can be not more than 25 at. %.

A source S2 and a drain D2 are separated from each other in the first semiconductor layer 30. The source S2 and drain D2 may be regions where a conductive impurity, for example, an n-type impurity, is highly doped. The source S2 and drain D2 have a linearly plane shape that is parallel to a Z axis, and can extend from an end of an upper surface of the first semiconductor layer 30 to the other end thereof in a direction along the Z axis. However, the plane structure of the source S2 and drain D2 is not limited to the above example and can be diversely modified. For example, the source S2 and drain D2 may be extended by a predetermined length in the Z-axis direction from one end of the upper surface of the first semiconductor layer 30. The channel C2, between the source S2 and the drain D2, is a junction region of the first and second semiconductor layers 30 and 40. The source S2, the drain D2, and the channel C2 constitute a resistance sensor, and may be similar to those of a high electron mobility transistor (HEMT), which is a heterojunction transistor.

The channel of the HEMT exists in a heterojunction region of two semiconductor layers due to a difference in the energy band of the two semiconductor layers. For example, due to the difference in the height of the conduction band of the two semiconductor layers, charges (electrons) can be gathered on a boundary surface of the two semiconductor layers, which is between a source and a drain. In the electric field read/write head 100 according to the present embodiment, since the channel C2 exists in the junction region of the first and second semiconductor layers 30 and 40, the thickness of the channel C2 may be thin and uniform.

An insulation layer 50 and a write electrode 60 may be sequentially further provided on the second semiconductor layer 40 that is above the channel C2. The insulation layer 50 and the write electrode 60 can have various plane shapes. For example, the insulation layer 50 and the write electrode 60 may have a linear plane shape parallel to the Z-axis or may have widths gradually increasing in the Z-axis direction.

An air bearing surface (ABS) pattern layer (not shown) can be provided on a side surface, or a surface parallel to an X-Y plane, of the electric field read/write head 100. The structure of the ABS pattern layer is well known to one skilled in the art, and thus, not shown in FIG. 2. The ABS pattern layer functions to allow the electric field read/write head 100 to be lifted away from the surface of a recording medium. Also, although not shown in FIG. 2, contact electrodes contacting the source S2, the drain D2, and the write electrode 60 can be further provided.

According to the present embodiment, since the channel C2 of the resistance sensor can be formed to be thin, the electric field read/write head 100 exhibiting a superior resolution according to the head movement direction, that is, an X-axis direction can be implemented. For the conventional technology, in which the thickness of a channel is determined by an ion implantation process, it is difficult to form channels having a uniform thickness throughout the entire area of a substrate. However, in the present embodiment, since the channel C2 is provided between the two first and second semiconductor layers 30 and 40 that are heterogeneously combined, a plurality of channels having a relatively uniform thickness can be easily formed throughout the entire region of the substrate 10.

Also, in the electric field read/write head 100 according to the present embodiment, the underlayer 20 and the write electrode 60 are provided at both sides of the resistance sensor according to the head movement direction. The underlayer 20 and the write electrode 60 can function as a shield layer blocking an interference electric field during a read operation. In detail, when information recorded in a first bit area of a recording medium is read by using the resistance sensor, the interference electric field generated in an area adjacent to the first bit area may be shunted to ground through the underlayer 20 and the write electrode 60. The substrate 10 can be used as an electric field shield layer instead of the under layer 20. Alternatively, another layer formed between the substrate 10 and the underlayer 20, or the underlayer 20 and the first semiconductor layer 30, can be used as the electric field shield layer. As described above, the effect of the interference electric field during the read operation can be restricted so that the resolution of the resistance sensor can be improved.

In addition, the electric field read/write head 100 according to the present embodiment can have a very fast sensing speed because the electric field read/write head 100 has the source S2, drain D2, and channel C2 respectively identical to the source, drain, and channel of the HEMT. Also, when the resistance sensor is formed on a bulk Si substrate 1 as shown in FIG. 1, due to a drain induced barrier lowering (DIBL) effect, the sensitivity of the resistance sensor is lowered. However, in the electric field read/write head 100 according to the present embodiment, the channel C2 is thin and the underlayer 20 can restrict the DIBL effect so that the sensitivity of the resistance sensor can be improved.

Figure 3:
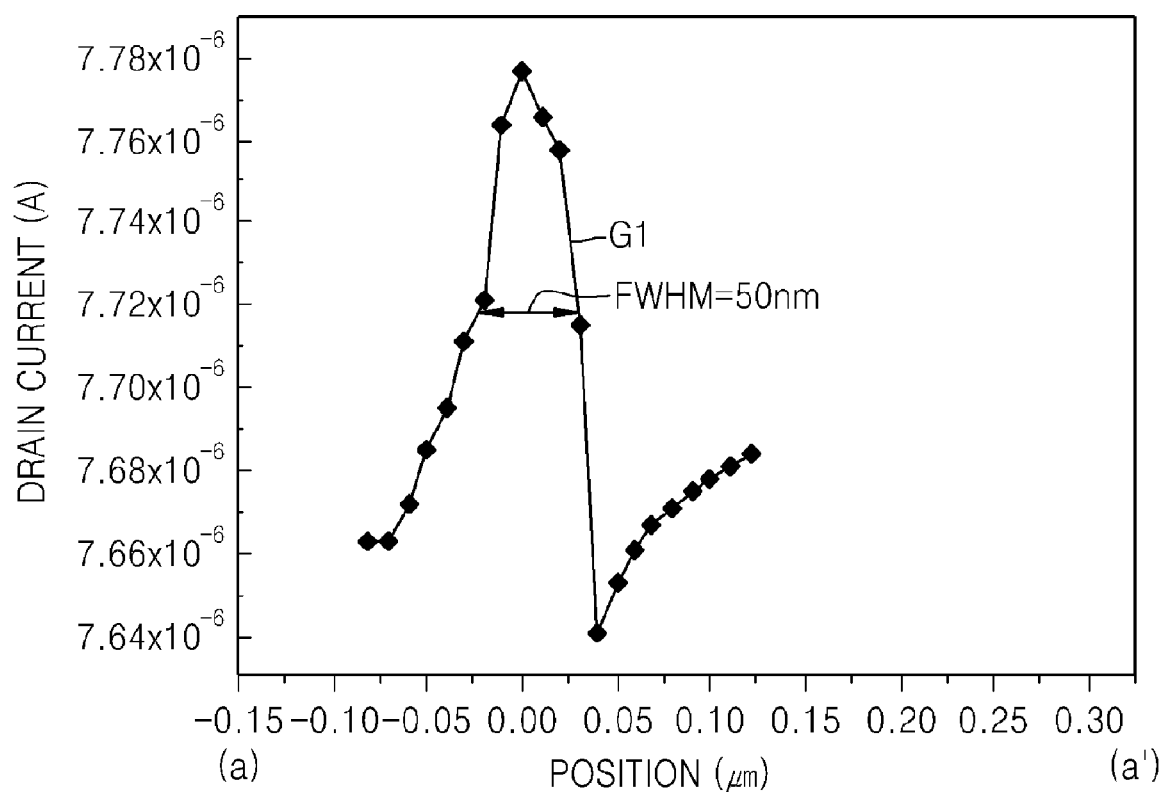
FIG. 3 is a graph showing a change in a drain current of the electric field read/write head of the present invention according to an external electric field, according to an embodiment of the present invention.

FIG. 3 is a graph showing a change in a drain current Id of the electric field read/write head 100 of the present invention according to an external electric field, according to an embodiment of the present invention. FIG. 3 shows a result of measurement of the drain current Id of the electric field read/write head 100 while moving a unit body (30 nm×30 nm×30 nm) that causes the external electric field from a point "a" to point "a'" of FIG. 2. In this experiment, the minimum distance between the unit body and the channel C2 is about 10 nm. The horizontal axis of the graph of FIG. 3 indicates the position of the unit body. When the center of the unit body and the center of the channel C2 are matched, the zero point of the horizontal axis corresponds to the position of the unit body. As the unit body moves from the point "a" to the point "a'" of FIG. 2, the value of the horizontal axis increases.

Referring to FIG. 3, the full width half maximum (FWHM) of the graph G1 is about 50 nm. Considering that the FWHM of a drain current Id profile in the simulation using the conventional electric field read/write head of FIG. 1 is about 100 nm, the electric field read/write head 100 according to the present embodiment has a resolution superior to that of the conventional electric field read/write head.

FIGS. 4A-4D are cross-sectional views showing a method of manufacturing the electric field read/write head 100, according to an embodiment of the present invention.

Figure 4A:
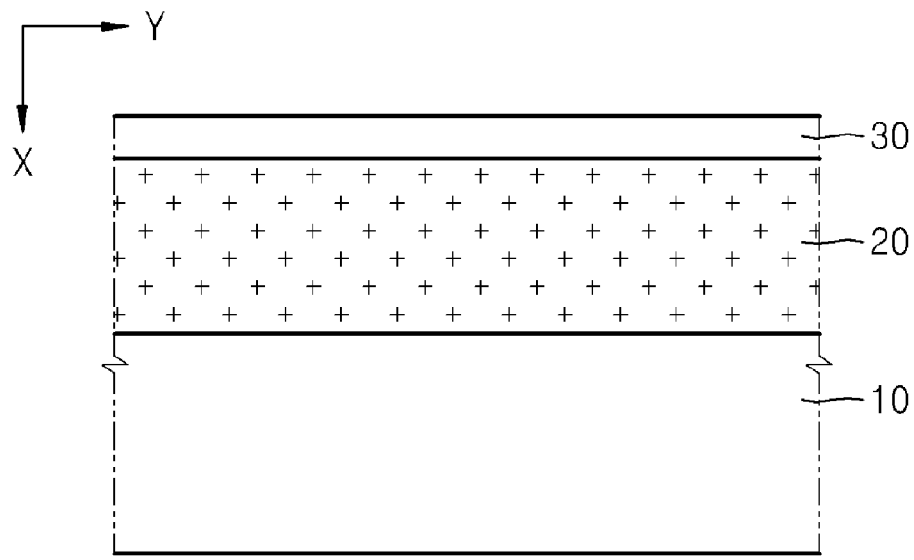
FIGS. 4A-4D are cross-sectional views showing a method of manufacturing the electric field read/write head, according to an embodiment of the present invention.

Referring to FIG. 4A, the underlayer 20 is formed on the substrate 10. The substrate 10 can be a GaAs substrate, and the underlayer 20 can be an AlGaAs layer with a thickness of over 100 nm. The forming of the underlayer 20 is optional. The first semiconductor layer 30 is formed on the underlayer 20, and the first semiconductor layer 30 can be an InGaAs layer and preferably have a thickness of 10-30 nm. In the InGaAs layer, the In content may not be more than 22 at. %.

Figure 4B:
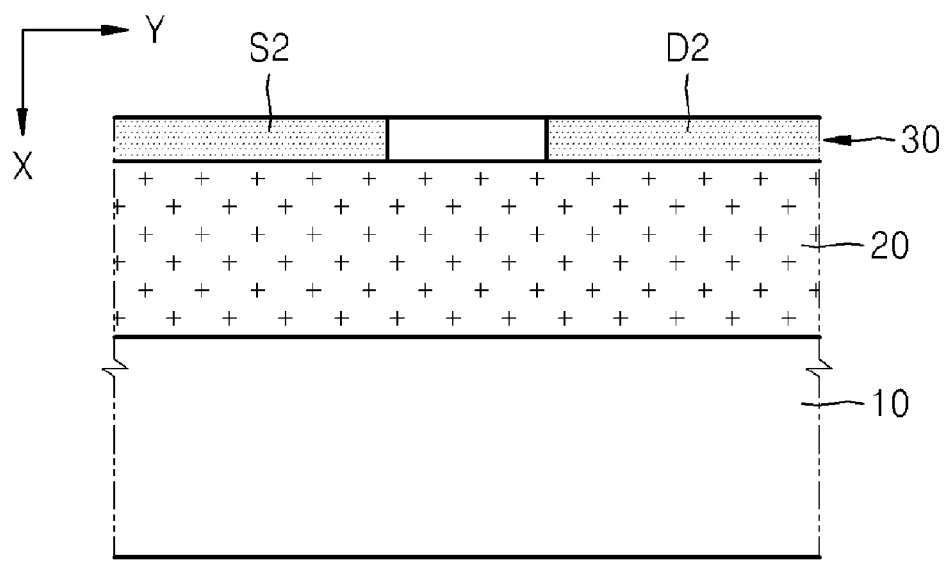

Referring to FIG. 4B, the source S2 and the drain D2 separated from each other by the channel C2 are formed in the first semiconductor layer 30. The source S2 and drain D2 can be formed by highly doping a conductive impurity, for example, n-type impurity.

Figure 4C:
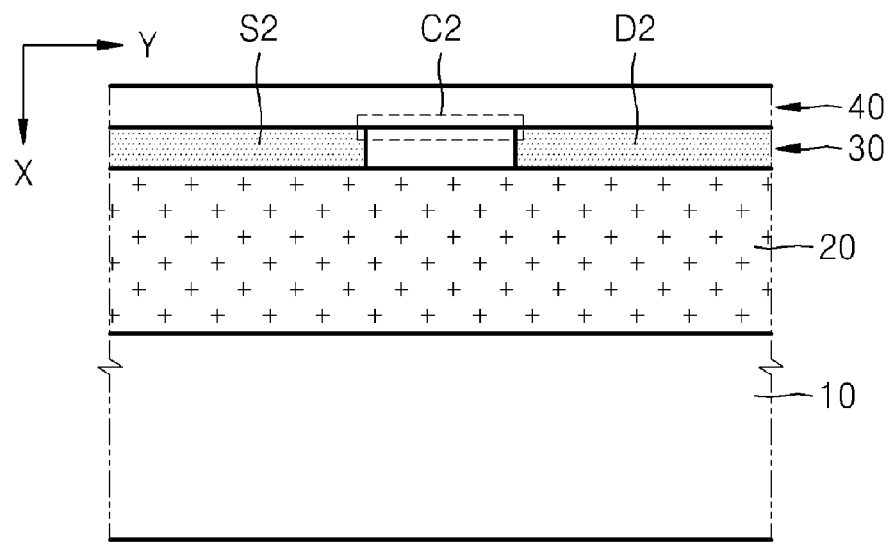

Referring to FIG. 4C, the second semiconductor 40 is formed on the first semiconductor layer 30, and the second semiconductor layer 40 can be an AlGaAs layer and preferably have a thickness of at least 10 nm. The Al content in the AlGaAs layer can be not more than 25 at. %. The second semiconductor layer 40 is heterogeneously combined with the first semiconductor layer 30. The conduction band of the second semiconductor layer 40 can be lower than that of the first semiconductor layer 30. As the second semiconductor layer 40 is formed, the channel C2 is formed in the heterojunction region of the first semiconductor layer 30 and the second semiconductor layer 40, such that the channel C2 is between the source S2 and the drain S2. The source S2, the drain D2, and the channel C2 constitute a resistance sensor.

Figure 4D:
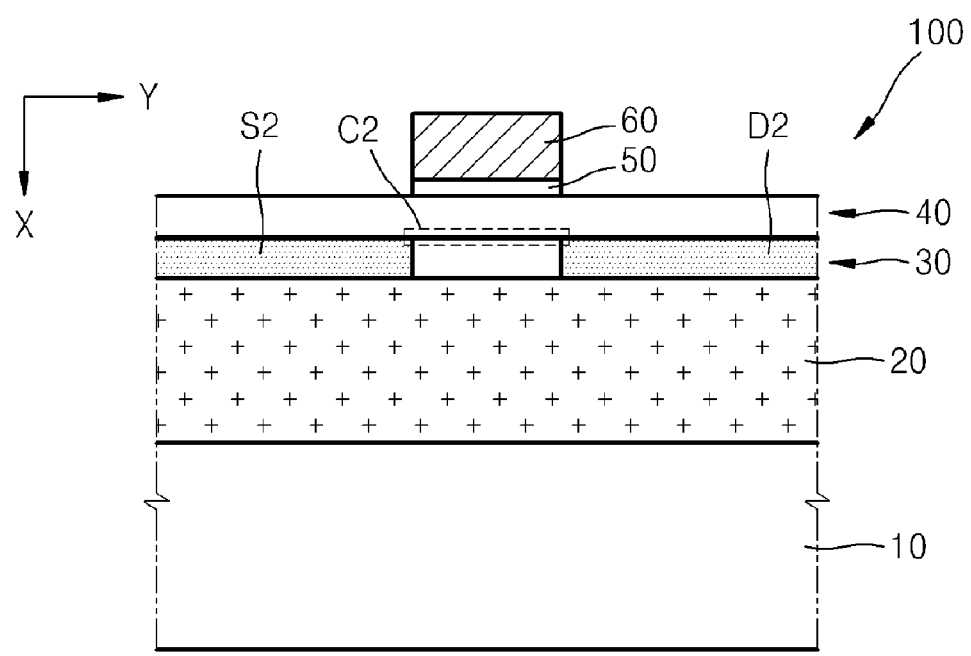

Referring to FIG. 4D, the insulation layer 50 and the write electrode 60 are sequentially formed on the second semiconductor layer 40 that is above the channel C2. Although it is not shown, contact electrodes that contact with the source S2, the drain D2, and the write electrode 60 may be respectively formed. An ABS pattern layer facing a recording medium can be formed on the side surface of the substrate 10 or the side surfaces of the substrate 10 and the underlayer 20.

Meanwhile, a method of manufacturing the plurality of electric field read/write heads 100 from a GaAs wafer will now be described in brief. The method may include: a first operation of forming at least one set of the source S2, the drain D2, the channel C2, the insulation layer 50, and the write electrode 60 on the GaAs wafer; a second operation of binding the at least one set into several groups and cutting the GaAs wafer into a group unit; a third operation of forming a plurality of ABS pattern layers on one side of GaAs wafer pieces cut in the group unit; and a fourth operation of separating the GaAs wafer piece according to each electric field read/write head 100.

Figure 5:
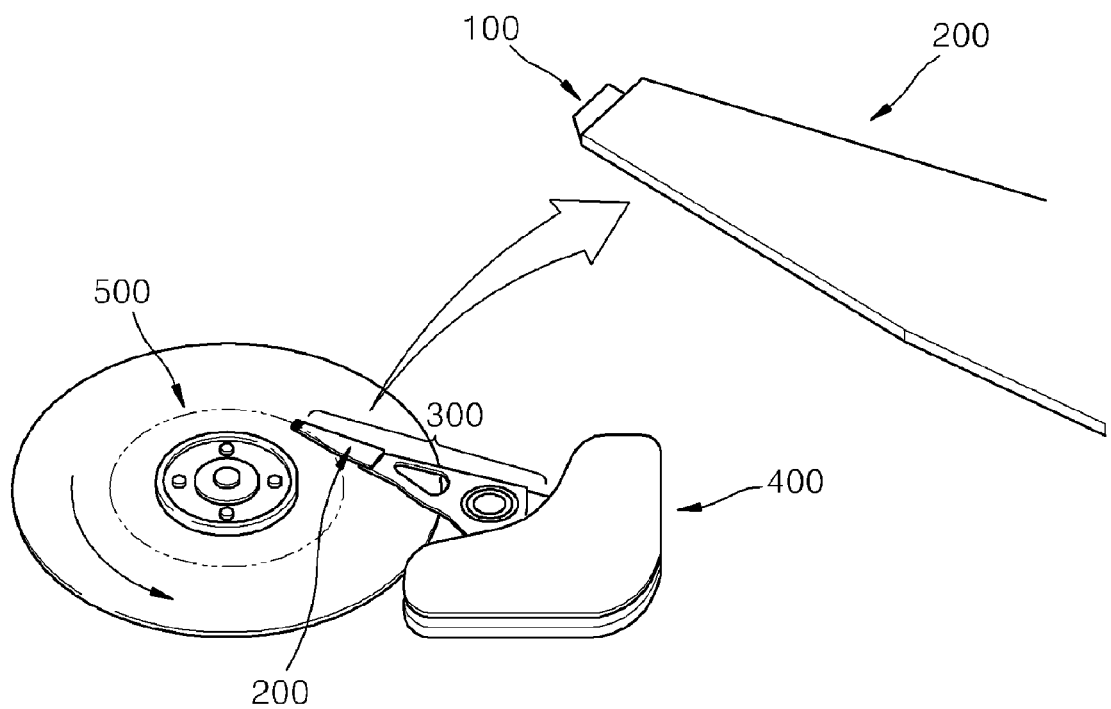
FIG. 5 is a perspective view of an information storage device including an electric field read/write head, according to an embodiment of the present invention.

FIG. 5 is a perspective view of an information storage device including the electric field read/write head 100, according to an embodiment of the present invention.

Referring to FIG. 5, the information storage device according to the present embodiment includes a recording medium 500 having a ferroelectric recording layer, and the electric field read/write head 100 writing information to the recording medium 500 and reading information from the recording medium 500. Since the electric field read/write head 100 is the same as that of FIG. 2, a description thereof will be omitted herein.

In the information storage device of the present embodiment, the recording medium 500 can be a rotating disc type of medium and include a grounded lower electrode (not shown) thereunder. The electric field read/write head 100, attached to a suspension 200 at an end portion of a swing arm 300, can pivot by being lifted away from the surface of the recording medium 500. The reference numeral 400 denotes a voice coil motor (VCM) 400 that pivots the swing arm 300.

The reading and writing principles of the information storage device according to an embodiment of the present invention are briefly described below.

<Reading Principle>

When the source S2 and drain D2 of the electric field read/write head 100 are both an n+ region and the channel C2 is an n− region, if the surface charge of the recording medium 500, on which the channel C2 is located, is negative (−), the density of electrons of the channel C2 is decreased so that the resistance value of the channel C2 increases and a current between the source S2 and drain D2 decreases. Reversely, if the surface charge of the recording medium 500, on which the channel C2 is located, is positive (+), the density of electrons of the channel C2 is increased so that the resistance value of the channel C2 decreases and the current between the source S2 and drain D2 increases. By detecting the change in the resistance and current, the information written to the surface of the recording medium 500 can be determined.

<Writing Principle>

When a positive (+) voltage, greater than a critical voltage, is applied to the write electrode 60 of the electric field read/write head 100, since the lower electrode arranged under the recording medium 500 is 0V, the surface charge of the recording medium 500 becomes negative (−). Reversely, when a negative (−) voltage under the critical voltage is applied to the write electrode 60 of the electric field read/write head 100, since the lower electrode arranged under the recording medium 500 is 0V, the surface charge of the recording medium 500 becomes positive (+). Thus, the polarization direction of the electrical domain of the ferroelectric recording medium 500 changes according to the amount of the voltage applied to the write electrode 60, and accordingly, information can be recorded.

While this invention has been particularly shown and described with reference to embodiments thereof, it will be understood by one skilled in the art that various changes in form and details may be made therein without departing from the spirit and scope of the invention as defined by the appended claims. For example, one skilled in the art can variously change the structure of the source S2, the drain D2, the channel C2, and the write electrode 60 of FIG. 2. Also, other substrates and semiconductor layers can be used as the substrate 10, the underlayer 20, the first and second semiconductor layers 30 and 40, instead of the GaAs substrate, the first AlGaAs substrate, the InGaAs layer, and the second AlGaAs layer, respectively. Furthermore, the electric field head according to an embodiment of the present invention can be used as a read-only head without the write electrode 60. Therefore, the scope of the invention is defined not by the detailed description of the invention but by the appended claims, and all differences within the scope will be construed as being included in the present invention.

What is claimed is:
1. An apparatus comprising:
a read sensor of an electric field head, the read sensor comprising a first semiconductor layer defining a source and a drain, and a second semiconductor layer heterogeneously combined with the first semiconductor layer to form a channel between the source and the drain as a heterojunction region of the first and second semiconductor layers; and
an air bearing surface (ABS) layer configured to fluidically support the read sensor adjacent a rotatable recording medium as the read sensor senses data stored thereto.

2. The apparatus of claim 1, wherein the first semiconductor layer is an InGaAs layer and the second semiconductor layer is an AlGaAs layer.

3. The apparatus of claim 1, wherein the thickness of the first semiconductor layer is about 10-30 nm.

4. The apparatus of claim 1, wherein the thickness of the second semiconductor layer is at least about 10 nm.

5. The apparatus of claim 1, wherein the first and second semiconductor layers are sequentially provided on a GaAs substrate.

6. The apparatus of claim 5, wherein a second AlGaAs layer is provided between the GaAs substrate and the first semiconductor layer.

7. The apparatus of claim 1, wherein the ABS layer is provided on a side surface of the electric field head.

8. The apparatus of claim 1, in which the source and drain are only formed in the first semiconductor layer.

9. The apparatus of claim 1, in which the read sensor is adapted to read data stored to the medium as the head is supported thereabove by the ABS layer responsive to a sensed resistance between the drain and source.

10. The apparatus of claim 1, further comprising a write sensor comprising a write electrode and an insulation layer disposed between the write electrode and the channel, the write sensor configured to write data to the rotatable data storage medium as the electric field head is supported adjacent thereto via the ABS layer.

11. The apparatus of claim 10, in which the write sensor writes data to the medium responsive to application of write currents to the write electrode.

12. An apparatus comprising
an electric field head adapted to write data to and read data from a rotatable data storage medium, the head comprising:
a read sensor comprising a first semiconductor layer defining a source and a drain, and a second semiconductor layer heterogeneously combined with the first semiconductor layer to form a channel between the source and the drain as a heterojunction region of the first and second semiconductor layers;
a write sensor comprising a write electrode and an insulating layer disposed between the write electrode and the channel; and
an air bearing surface (ABS) layer configured to support the electric field head at a selected fly height above the storage medium during rotation thereof.

13. The apparatus of claim 12, in which the read sensor is adapted to read data stored to the medium as the head is supported thereabove by the ABS layer responsive to a sensed resistance between the drain and source.

14. The apparatus of claim 12, in which the write sensor is adapted to write data to the medium as the head is supported thereabove by the ABS layer responsive to application of write currents to the write electrode.

15. The apparatus of claim 12, in which the source and drain are only formed in the first semiconductor layer.

16. The apparatus of claim 12, wherein the first semiconductor layer is an InGaAs layer and the second semiconductor layer is an AlGaAs layer.

17. The apparatus of claim 12, wherein the thickness of the first semiconductor layer is about 10-30 nm and the thickness of the second semiconductor layer is at least about 10 nm.

18. The apparatus of claim 12, wherein the first and second semiconductor layers are sequentially provided on a GaAs substrate.

19. The apparatus of claim 18, wherein a second AlGaAs layer is provided between the GaAs substrate and the first semiconductor layer.

20. The apparatus of claim 12, wherein the ABS layer is affixed to the first and second semiconductor layers.

* * * * *